United States Patent [19]

Koike

[11] Patent Number: 5,544,106
[45] Date of Patent: Aug. 6, 1996

[54] SEMICONDUCTOR MEMORY DEVICE WITH REDUNDANT DECODER AVAILABLE FOR TEST SEQUENCE ON REDUNDANT MEMORY CELLS

[75] Inventor: Hiroki Koike, Tokyo, Japan

[73] Assignee: NEC Corporation, Tokyo, Japan

[21] Appl. No.: 388,485

[22] Filed: Feb. 14, 1995

[30] Foreign Application Priority Data

Feb. 15, 1994 [JP] Japan .................................. 6-039281

[51] Int. Cl.⁶ .................................................. G11C 7/00
[52] U.S. Cl. ............................................ 365/200; 365/201
[58] Field of Search .................................... 365/200, 201

[56] References Cited

U.S. PATENT DOCUMENTS 5,373,471  12/1994  Saeki et al. ............................. 365/201

FOREIGN PATENT DOCUMENTS

1-273298  11/1989  Japan .
2-144000  6/1990  Japan .

Primary Examiner—David C. Nelms
Assistant Examiner—Son Dinh
Attorney, Agent, or Firm—Sughrue, Mion, Zinn, Macpeak & Seas

[57] ABSTRACT

A semiconductor dynamic random access memory device is equipped with rows of redundant memory cells for replacing defective rows of regular memory cells therewith, and a redundant system associated with the rows of redundant memory cells is enabled in a test sequence for selectively energizing redundant word lines in response to external address signals so as to eliminate an address pointer only used in the test sequence.

8 Claims, 10 Drawing Sheets

SEMICONDUCTOR MEMORY DEVICE WITH REDUNDANT DECODER AVAILABLE FOR TEST SEQUENCE ON REDUNDANT MEMORY CELLS

FIELD OF THE INVENTION

This invention relates to a semiconductor memory device and, more particularly, to a semiconductor memory device equipped with a redundant decoder available for a test sequence on redundant memory cells.

DESCRIPTION OF THE RELATED ART

A redundant technology rescues defective products, and enhances the production yield of the semiconductor integrated circuit device. A typical redundant technology applied to a semiconductor memory device memorizes addresses of defective memory cells, and replaces the defective memory cells with redundant memory cells upon accesses to the defective memory cells.

Figure 1:
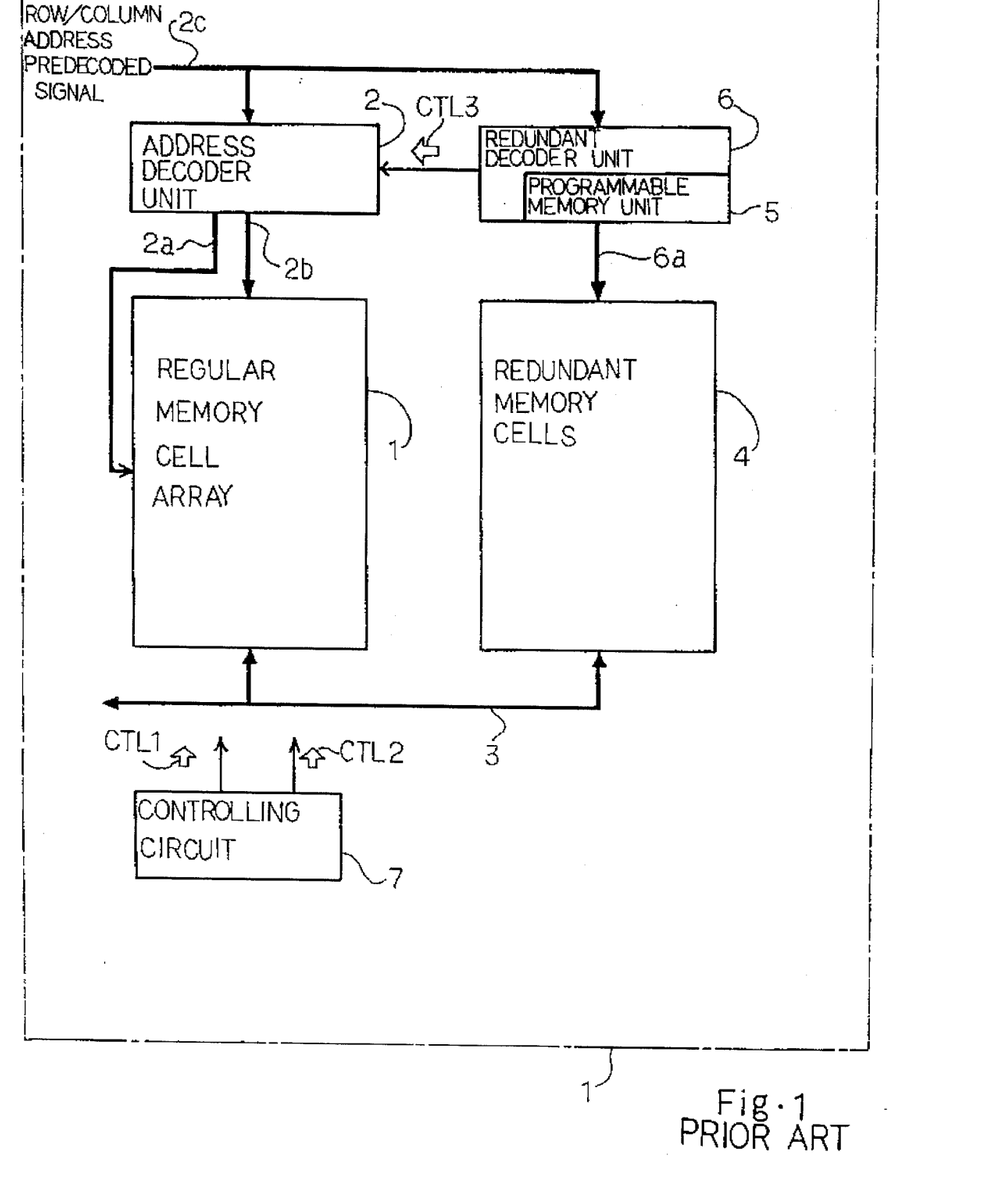
FIG. 1 is a schematic view showing the prior art semiconductor memory device.

FIG. 1 illustrates a typical example of the semiconductor memory device equipped with the redundant memory cells, and the prior art semiconductor memory device is fabricated on a semiconductor substrate 1. The prior art semiconductor memory device comprises a regular memory cell array 1 for storing data bits and an address decoder unit 2 for selecting a regular memory cell from the regular memory cell array 1. A plurality of regular memory cells form the regular memory cell array 1, and are arranged in rows and columns. The plurality of regular memory cells are associated with regular word lines 2a and regular bit line pairs (not shown), and the address decoder unit 2 has a row addressing sub-unit selectively energizing the regular word lines 2a and a column addressing sub-unit for selecting one of the regular bit line pairs by means of decoded signal lines 2b. A row address predecoded signal and a column address predecoded signal are supplied through an address signal line 2c to the address decoder unit 2, and row addressing sub-unit and the column addressing sub-unit causes a regular memory cell assigned the row and column addresses specified by the row/column address predecoded signals to be coupled through the associated bit line pair to a data bus 3. As a result, the data bit is read out from the selected regular memory cell, or a new data bit is written into the selected regular memory cell.

The prior art semiconductor memory device further comprises two rows of redundant memory cells 4 for storing the data bits instead of defective regular memory cells, a programmable memory unit 5, a redundant decoder unit 6 coupled to the address predecoded signal line 2c and a controlling unit 7 for controlling a replacement of defective regular memory cells with the redundant memory cells with a precharge control signal CTL1 and a strobe signal CTL2. Two redundant word lines 6a are respectively coupled to the two rows of redundant memory cells 4, and the bit line pairs (not shown) are further coupled to the rows of redundant memory cells. If the row address predecoded signal is representative of the row address assigned to a row of regular memory cells containing a defective memory cell not available for storing a data bit, the redundant decoder unit 6 causes the rows of redundant memory cells to be accessible instead of the regular memory cell array 1. Namely, if a manufacturer notices a row or rows of defective regular memory cells through a test sequence before delivery from the manufacturing facility, the manufacturer writes the row address or the row addresses assigned to the row or rows of defective regular memory cells into the programmable memory unit 5. After installation of the semiconductor memory device into an electronic circuit, the redundant decoder unit 6 compares the row address represented by the row address predecoded signal with the row addresses stored in the programmable memory unit 5. While the row address predecoded signal is indicative of a row of excellent regular memory cells, the address decoder unit 2 selects a regular memory cell from the regular memory cell array 1 as described hereinbefore. However, if the row address represented by the row address predecoded signal is matched with one of the row addresses stored in the programmable memory-unit 5, the redundant decoder unit 6 changes a disable signal CTL3 to an active level, and energizes one of the redundant word lines 6a. The disable signal CTL3 of the active level disables the row addressing sub-unit, and the row addressing sub-unit maintains the regular word lines inactive. On the other hand, the selected redundant word line 6a makes the row of redundant memory cells accessible, and the column addressing sub-unit couples one of the redundant memory cells through the bit line pair to the data bus 3. Thus, the rows of defective regular memory cells are replaced with the rows of redundant memory cells.

Figure 2:
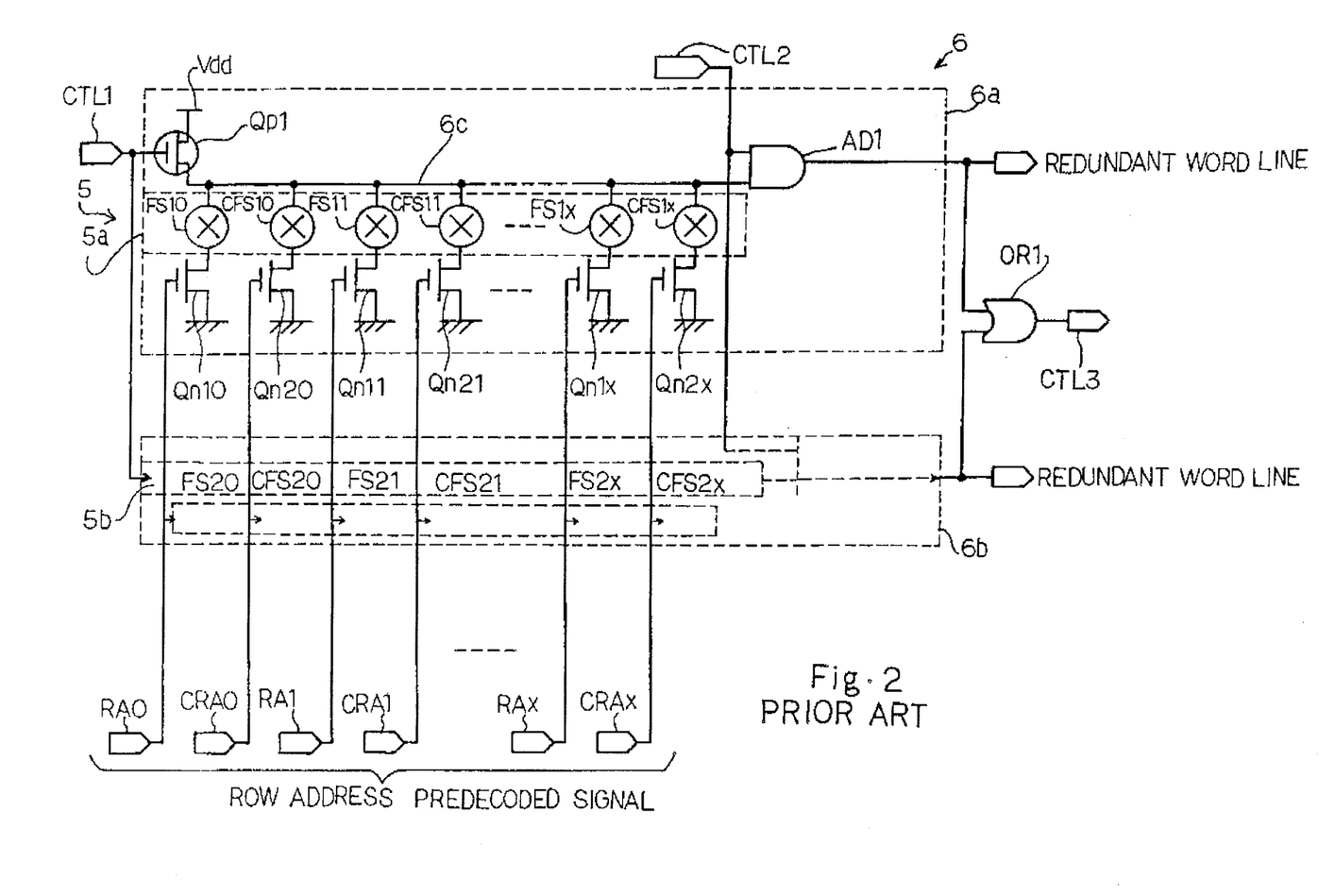
FIG. 2 is a circuit diagram showing the arrangement of the redundant decoder unit and the programmable memory unit incorporated in the prior art semiconductor memory device.

The redundant decoder unit 6 and the programmable memory unit 5 are illustrated in detail in FIG. 2, and row address bits RA0, RA1, ... and RAx and the complementary row address bits CRA0, CRA1, ... and CRAx form in combination the row address predecoded signal. The programmable memory unit 5 is implemented by two parallel combinations of fuse elements FS10, CFS10, FS11, CFS11, ... FS1x, CFS1x and FS20, CFS20, FS21, CFS21, ..., FS2x, CFS2x. The first parallel combination of fuse elements FS10 to CFS1x is associated with one of the rows of redundant memory cells 4, and the fuse elements FS10 to CFS1x are selectively broken so as to memorize the row address of the first row of defective regular memory cells. The second parallel combination of fuse elements FS20 to CFS2x is associated with the other of the rows of redundant memory cells 4, and the fuse elements FS20 to CFS2x are also selectively broken for storing the row address of the second row of defective regular memory cells.

The redundant decoder unit 6 comprises two redundant decoder sub-units 6a and 6b and an OR gate OR1, and the redundant decoder sub-unit 6a is identical in circuit arrangement with the other redundant decoder sub-unit 6b. For this reason, FIG. 2 illustrates the redundant decoder sub-unit 6a only.

The redundant decoder sub-unit 6a comprises a p-channel enhancement type charging transistor Qp1 coupled between a positive power voltage line Vdd and a precharge line 6c for the fuse elements FS10 to CFS1x, n-channel enhancement type switching transistors Qn10/Qn20, Qn11/Qn21, ... and Qn1x/Qn2x coupled between the fuse elements FS10 to CFS1x and the ground voltage line and an AND gate AD1.

The precharge control signal CTL1 is supplied to the gate electrode of the p-channel enhancement type charging transistor Qp1, and the precharge control signal CTL1 of the active low level causes the p-channel enhancement type charging transistor Qp1 to turn on for charging the precharge line 6c.

The true address bits RA0 to RAx and the complementary address bits CRA0 to CRAx are respectively supplied to the gate electrodes of the n-channel enhancement type switching transistors Qn10 to Qn2x, and the n-channel enhancement type switching transistors Qn10 to Qn2x selectively turn on for discharging the precharge line 6c.

The strobe signal CTL2 is supplied to an input node of the AND gate AD1, and the precharge line 6c is coupled to the other input node of the AND gate AD1. If all of the n-channel enhancement type switching transistors Qn10 to Qn2x in the on-state are coupled to the broken fuse elements, no discharging line is provided between the precharge line 6c and the ground voltage line, and the precharge line 6c is maintained at the positive voltage level Vdd. In this situation, the strobe signal CTL2 of the high voltage level causes the AND gate AD1 to energize the associated redundant word line, and the OR gate OR1 changes the disable signal CTL3 to the active high level. The disable signal CTL3 does not allow the row addressing sub-system to respond to the row address predecoded signal, and the selected row of redundant memory cells are coupled to the bit line pairs for the write-in and the read-out.

Another prior art semiconductor memory device may have columns of redundant memory cells, and columns of defective regular memory cells are replaced with the columns of redundant memory cells.

Figure 3:
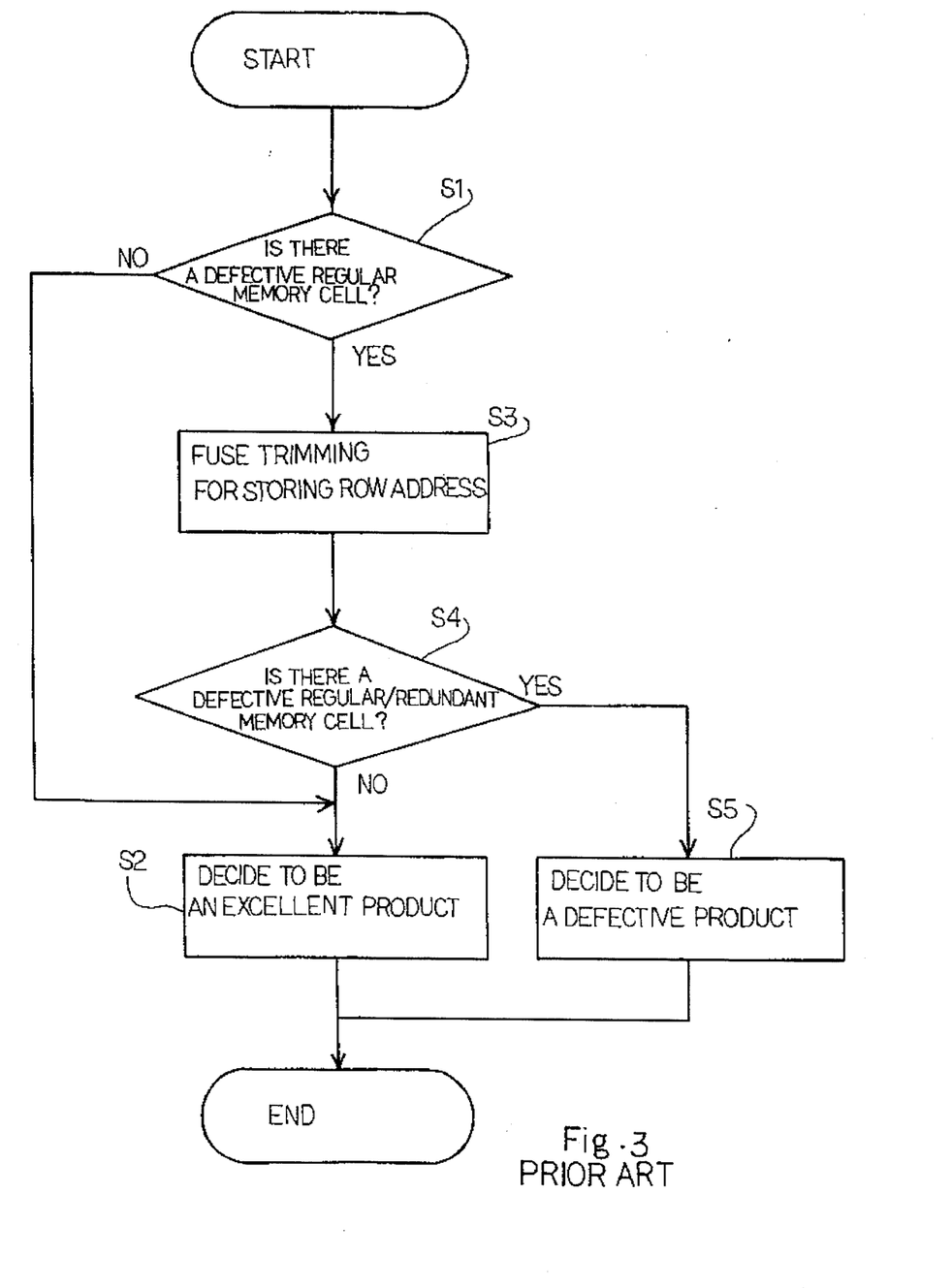
FIG. 3 is a flow chart showing the test sequence for the prior art semiconductor memory device.

FIG. 3 illustrates a programming work through the test sequence before the delivery from the manufacturing facility. First, the manufacturer carries out the test to see whether or not the regular memory cell array 1 contains a defective regular memory cell as by step S1. If all of the regular memory cells are excellent, the answer at step S1 is given negative, and the semiconductor memory device is decided to be an excellent product as by step S2.

On the other hand, if the regular memory cell array 1 contains a defective regular memory cell, the answer at step S1 is given affirmative, and the manufacturer carries out a trimming on one of the rows of redundant memory cells 5a as by step S3. Of course, if defective memory cells are distributed over two rows of regular memory cells, the row addresses of defective regular memory cells are respectively memorized in the parallel combinations 5a and 5b of the programmable memory unit 5. Assuming now that the row address is represented by (10 . . . 1), the fuse elements FS10, CFS11, . . . and FS1x are broken, and the other fuse elements are left to be conductive.

After the fuse trimming, the manufacturer carries out the test on the excellent regular memory cells and the replaced redundant memory cells to see whether or not a defective memory cell is found as by step S4. If a defective redundant memory cell is found, the answer at step S4 is given affirmative, and the semiconductor memory device is decided to be a defective product as by step S5. On the other hand, if all of the memory cells are excellent, the manufacturer decides the semiconductor memory device to be an excellent product as by step S2.

Thus, the defective products are screened, and the excellent products are delivered to a customer. The redundant memory cells 4 enhance the production yield, and decrease the price of the semiconductor memory device.

However, the memory cells are progressively miniaturized, and a crystal defect damages a larger number of miniaturized regular memory cells. This means that the crystal defect damages a redundant memory cell at a high possibility. If the replaced row of redundant memory cells contains the defective memory cell, the semiconductor memory device is rejected at step 4, and the programming waste time.

In order to test the redundant memory cells prior to the programming, Japanese Patent Publication of Unexamined Application Nos. 1-273298 and 2-144000 disclose an approach.

Japanese Patent Publication of Unexamined Application No. 2-144000 discloses a memory device testing apparatus, and the testing apparatus examines the redundant memory cells before registration of the addresses assigned to defective regular memory cells. Namely, if the testing apparatus notices a defective redundant memory cell, the testing apparatus memorizes the address assigned to the defective redundant memory cell, and changes the defective redundant memory cell to an excellent memory cell. Thus, the prior art testing apparatus allows the semiconductor memory device to replace defective regular memory cells with the excellent memory cells through the registration. However, the Japanese Patent Publication of Unexamined Application does not disclose the circuit arrangement of the semiconductor memory device.

Figure 4:
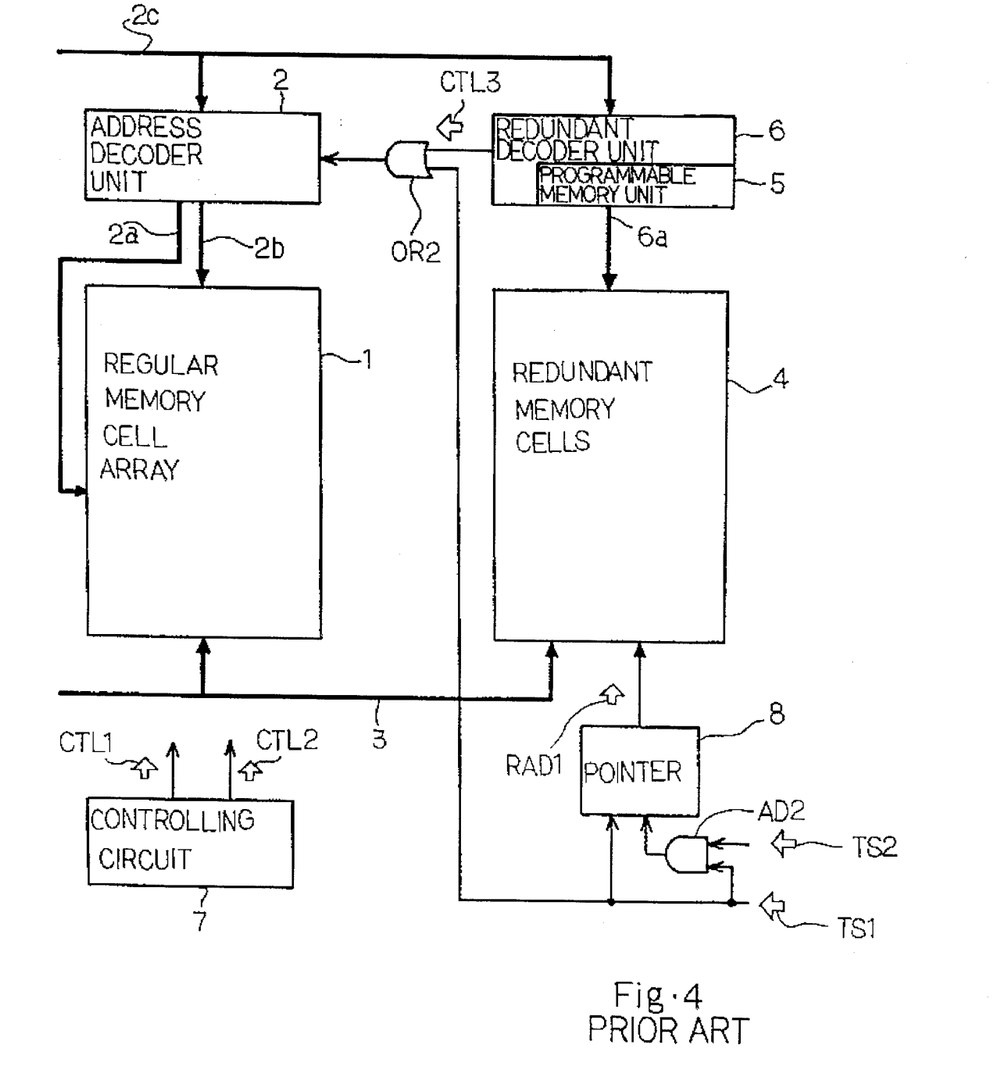
FIG. 4 is a schematic view showing the prior art semiconductor memory device disclosed in Japanese Patent Publication of Unexamined Application No. 1-273298.

FIG. 4 illustrates-the semiconductor memory device disclosed in Japanese Patent Publication of Unexamined Application No. 1-273298, and the references used for the first prior art designate the corresponding components of the semiconductor memory device disclosed in the Japanese Patent Publication. The semiconductor memory device disclosed in the Japanese Patent Publication further comprises an AND gate AD2, an OR gate OR2 and a pointer 8. A test mode signal TS1 is supplied to the AND gate AD2, the OR gate OR2 and the pointer 8, and a test clock signal TS2 is supplied to the AND gate AD2. The OR gate OR2 transfers the test mode signal TS1 of the high level to the address decoder unit 2, and the test mode signal TS1 of the high level disables the address decoder unit 2 instead of the disable signal CTL3. The test mode signal TS1 is changed to the low level, and the test mode signal TS1 of the low level initializes the pointer. The test mode signal TS1 of the high level makes the AND gate AD2 responsive to the test clock signal TS2, and the AND gate AD2 transfers the test clock signal TS2 to the pointer 8. The pointer 8 is implemented by a shift register or a counter, and is responsive to the test clock signal for incrementing an address signal RAD1 in the presence of the test mode signal TS1. The address signal RAD1 sequentially specifies the redundant memory cells 4. Test data bits are written into and thereafter read out from the redundant memory cells 4 so as to see whether or not there is a defective redundant memory cell.

Figure 5:
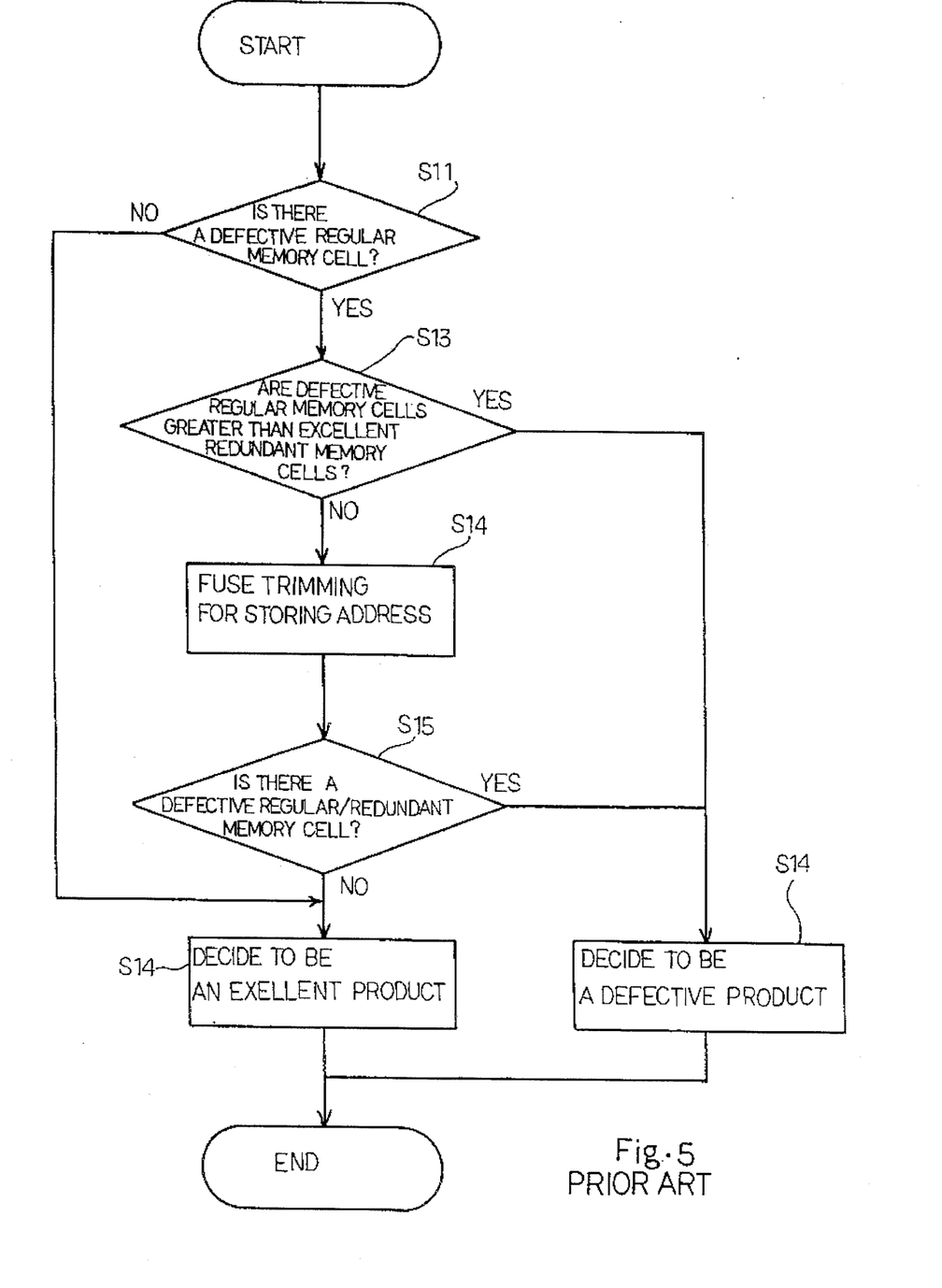
FIG. 5 is a flow chart showing the test sequence for the second prior art semiconductor memory device.

The second prior art semiconductor memory device is subjected to a test sequence shown in FIG. 5. Namely, the regular memory cell array 1 is subjected to the test, and the manufacturer determines whether or not a defective regular memory cell is incorporated in the regular memory cell array 1 as by step S11. If all of the regular memory cells are excellent, the manufacturer decides the second prior art semiconductor memory device to be an excellent product as by step S12, and terminates the test sequence.

On the other hand, if a defective regular memory cell is found in the regular memory cell array 1, the answer at step S11 is given affirmative, and the manufacturer carries out the test for the redundant memory cells 4 by using the test mode signal TS1 and the test clock signal TS2. Then, the manufacturer determines whether or not the defective regular memory cells are greater than the excellent redundant memory cells as by step S13. If the defective regular memory cells are greater than the excellent redundant memory cells, the answer at step S13 is given affirmative, and the manufacturer decides the second prior art memory device to be a defective product as by step S14, and terminates the test sequence.

On the other hand, if the defective regular memory cells are equal to or less than the excellent redundant memory cells, the answer at step S13 is given negative, and the redundant memory cells 4 can rescue the second prior art semiconductor memory device. Only the excellent redundant memory cells are used for the rescue, and the manufacturer carries out the fuse trimming for storing the addresses of the defective regular memory cells into the programmable memory unit 5 as by step S14.

Subsequently, the manufacturer examines the second prior art semiconductor memory device to see whether or not a defective regular/redundant memory cell is found as by step S15. If all of the addressable memory cells are excellent, the answer at step S15 is given negative, and the second prior art semiconductor memory device to be an excellent product. On the other hand, if the fuse trimming does not make the programmable memory unit 5 exactly store the address of a defective regular memory cell, a defective regular/redundant memory cell is still accessed, and the answer at step S15 is given affirmative. The manufacturer decides the second prior art semiconductor memory device to be a defective product.

In the second prior art semiconductor memory device, a defective regular memory cell is never replaced with a defective redundant memory cell, and only the excellent redundant memory cells are used for the rescue. This results in enhancement of the yield.

As will be understood from the foregoing description, the manufacturer previously examines the redundant memory cells, and replaces the defective regular memory cells with only the excellent redundant memory cells. As a result, the non-recoverable products are screened out at early stage, and the fuse trimming effectively rescues recoverable products.

However, the second prior art semiconductor memory device encounters a problem in that the pointer 8 occupies a substantial amount of real estate. As described hereinbefore, if the regular memory cells are miniaturized for increasing the memory capacity, a larger number of regular memory cells are damaged by a single crystal defect, and, accordingly, require a larger number of redundant memory cells. This results in that a larger pointer for sequentially addressing the redundant memory cells, and the occupation area does not become ignoreable.

SUMMARY OF THE INVENTION

It is therefore an important object of the present invention to provide a semiconductor memory device which allows a manufacturer to examine redundant memory cells without a pointer.

To accomplish the object, the present invention proposes to use a redundant addressing unit in not only a standard access mode but also a test mode for the redundant memory cells.

In accordance with the present invention, there is provided a semiconductor memory device having a standard mode and a test mode, comprising: a) a plurality of addressable regular memory cell groups for storing data bits; b) a plurality of addressable redundant memory cell groups, each of the plurality of addressable regular memory cell groups being replaceable with one of the plurality of addressable redundant memory cell groups; c) an addressing system responsive to a plurality of external address bits in both standard and test modes so as to allow an external device to selectively access the data bits stored in the plurality of addressable regular memory cell groups in the absence of a disable signal; and d) a redundant system having d-1) a programmable memory unit for storing at least one address assigned to one of the plurality of addressable regular memory cell groups after the test mode, d-2) a redundant decoder unit activated in the standard mode and operative to compare an address represented by first address bits of the plurality of address bits with the aforesaid at least one address to see whether or not the address is matched with the aforesaid at least one address, the redundant decoder unit generating a hit signal when the address is matched with the aforesaid at least one address, and d-3) a redundant addressing unit responsive to the hit signal in the standard mode so as to replace the aforesaid one of the plurality of addressable regular memory cell groups with one of the plurality of redundant memory cell groups assigned the aforesaid at least one address in the standard mode, the redundant addressing unit being further operative to generate the disable signal when the aforesaid one of the plurality of redundant memory cell groups is selected in both standard and test modes, the redundant addressing unit being further responsive to second address bits in the presence of a test signal in the test mode so as to allow an external device to sequentially access the plurality of redundant memory cell groups.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 6:
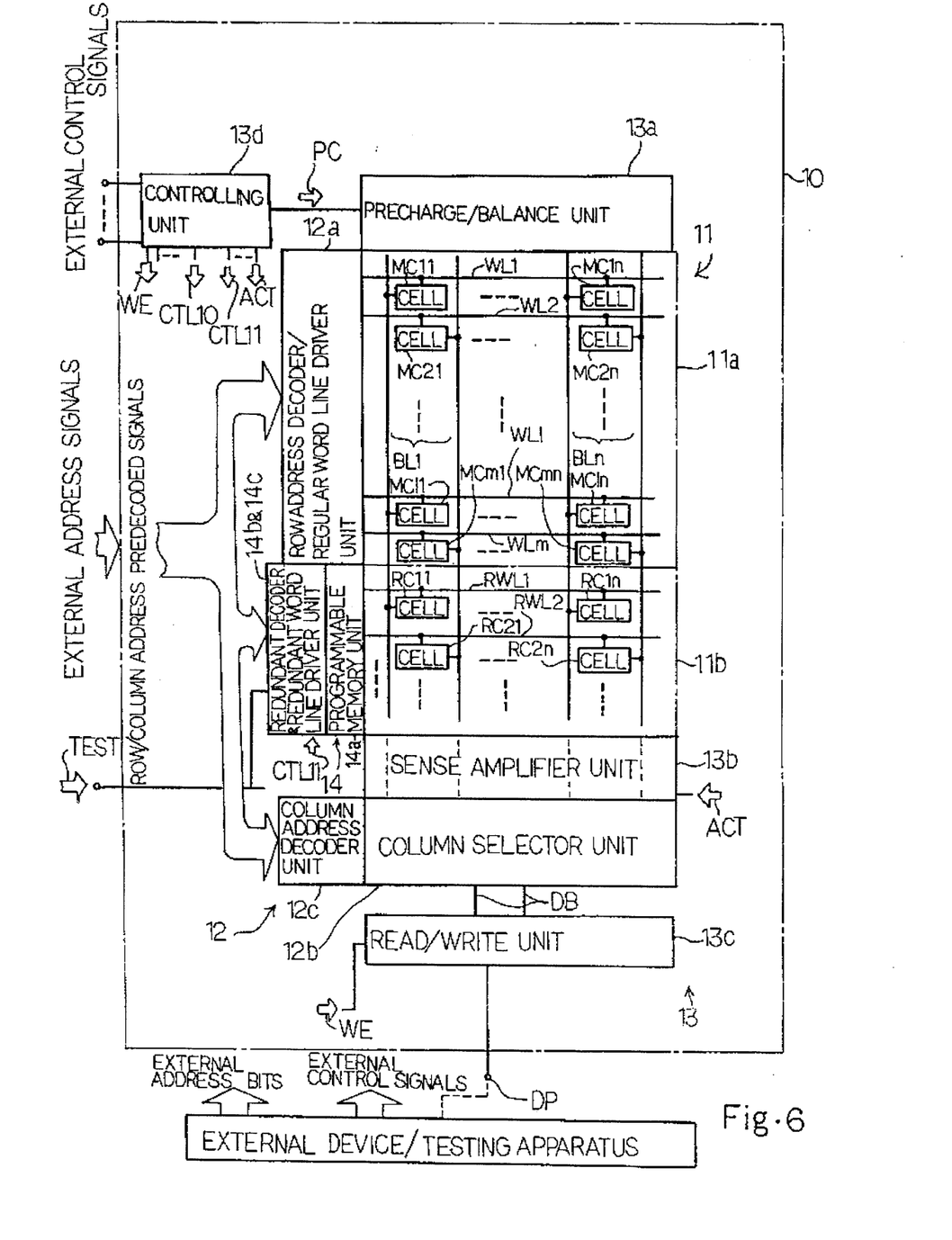
FIG. 6 is a block diagram showing a semiconductor dynamic random access memory device according to the present invention.

Referring to FIG. 6 of the drawings, a semiconductor dynamic random access memory device embodying the present invention is fabricated on a single semiconductor substrate 10, and largely comprises a data storage 11, an addressing system 12, a data read/write system 13 and a redundancy system 14. Although a built-in test system is incorporated in the semiconductor dynamic random access memory device for assisting various tests, it is not illustrated in the drawings.

After installation into an electronic system, the semiconductor dynamic random access memory device selectively starts a write-in sequence and a read-out sequence with external address signals, and serves as a data storage facility in the electronic system. The write-in sequence and the read-out sequence are carried out in a standard mode, and the semiconductor dynamic random access memory device is subjected to tests in a test mode before delivery to a user, and the built-in test system checks the data storage 11 and other circuits to see whether or not a defective circuit component is incorporated. While the semiconductor dynamic random access memory device is being subjected to the tests, a testing apparatus serves as the external device.

The data storage 11 comprises a regular memory cell array 11a, a redundant memory cell array 11b and a plurality of bit line pairs BL1 to BLn shared between the regular memory cell array 11a and the redundant memory cell array 11b.

The regular memory cell array 11a is implemented by a plurality of regular memory cells MC11 to MC1n, MC21 to MC2n, MCl1 to MCln, and MCm1 to MCmn, and the plurality of regular memory cells MC11 to MCmn are arranged in rows and columns.

The redundant memory cell array 11b is implemented by redundant memory cells RC11 to RC1n, RC21 to RC2n, . . ., and the plurality of redundant memory cells RC11 to RC1n, RC21 to RC2n, . . . are also arranged in rows and columns. Though not shown in the drawings, the regular memory cells MC11 to MCmn and the redundant memory cells RC11 to RC1n, RC21 to RC2n, . . . are of the one-transistor and one-capacitor type, i.e., a series of a switching transistor and a storage capacitor, and store data bits in the form of electric charge.

The plurality of bit line pairs BL1 to BLn are respectively associated with the columns of regular memory cells MC11 to MCm1, . . . and MC1n to MCmn and the columns of redundant memory cells RC11, RC21, . . . , . . . , and RC1n, RC2n . . . . The switching transistors of the regular/redundant memory cells are alternately connected to the bit lines of the associated pair, and the data bits are propagated through the bit line pairs BL1 to BLn in the form of potential difference.

If all of the regular memory cells MC11 to MCmn are excellent, data bits are written into and read out from the regular memory cells MC11 to MCmn, and the redundant memory cells RC11 to RC1n, RC21 to RC2n, . . . are useless. In this instance, the rows of regular memory cells are a plurality of addressable regular memory cell groups, and the rows of redundant memory cells serve as a plurality of addressable redundant memory cell groups.

The addressing system 12 comprises a plurality of regular word lines WL1, WL2, . . . , WLl and WLm, a row address decoder/regular word line driver unit 12a, a column selector unit 12b and a column address decoder unit 12c, and causes one of the regular memory cells MC11 to MCmn to be accessible through the data read/write system 13.

The regular word lines WL1 to WLm are respectively associated with the rows of regular memory cells MC11 to MC1n, MC21 to MC2n, . . . , MCl1 to MCln and MCm1 to MCmn, and are coupled to gate electrodes of the switching transistors of the associated regular memory cells MC11 to MCmn.

The row address decoder/regular word line driver unit 12a is responsive to row address predecoded signals for selectively energizing the regular word lines WL1 to WLm, and the row address predecoded signals are generated from one of the external address signals. When one of the regular word lines WL1 to WLm is energized, the switching transistors of the associated regular memory cells turn on, and the storage capacitors are electrically connected to the associated bit lines.

Column address predecoded signals are further generated from another external address signal, and the column address decoder unit 12c is supplied to the column address decoder unit 12c. The column address decoder unit 12c is responsive to the column address predecoded signals, and the column selector unit 12b selectively couples one of the bit line pairs BL1 to BLn to a data bus DB under the control of the column address decoder unit 12c.

The data read/write system 13 comprises a precharge and balancing unit 13a, a sense amplifier unit 13b, a read/write unit 13c and a controlling unit 13d, and writes a data bit into and reads out a data bit from the data storage 11 through the write-in sequence and the read-out sequence.

The precharge and balancing unit 13a is responsive to a precharge control signal PC, and balances the bit lines of the pairs BL1 to BLn at a precharge level between high and low voltage levels before the selection of a regular word line.

The sense amplifier unit 13b is coupled to the bit line pairs BL1 to BLn, and is responsive to an activation signal ACT changed to an active level after the selection of the regular word line in the read-out sequence. Upon the activation of the sense amplifier unit 13b, small potential differences on the bit line pairs are developed.

The read/write unit 13c is coupled between the data bus DB and a data pin DP, and changes an operation between a write-in phase and a read-out phase in response to a write enable signal WE. The read/write unit 13c generates an output data signal from the potential difference on the data bus DB in the read-out phase, and produces a potential difference on the data bus DB from an input data signal.

The controlling unit 13d is responsive to external control signals for sequentially generating internal control signals such as the Write enable signal WE, the activation signal ACT and the precharge control signal PC. Other internal control signals are described hereinlater in connection with the redundant system 14.

The redundancy system 14 comprises a programmable memory unit 14a, a redundant decoder unit 14b, a redundant word line driver unit 14c and a plurality of redundant word lines RWL1, RWL2, . . . respectively associated with the rows of redundant memory cells RC11 to RC1n, RC21 to RC2n, . . . . In this instance, the redundant word line driver unit 14c serves as a redundant addressing unit.

The programmable memory unit 14a stores row addresses of defective rows of regular memory cells. While the semiconductor dynamic random access memory device is being in the standard mode, the redundant decoder unit 14b compares the row addresses stored in the programmable memory unit 14a with a row address represented by the row address predecoded signals to see whether or not the external row address signal specifies the row address of one of the defective rows. If the row address is matched with one of the stored row addresses, the redundant word line driver unit 14c energizes the associated redundant word line RWL1/RWL2, . . . , and produces a disable signal DIS. The disable signal DIS is supplied to the row address decoder/word line driver unit 12a, and the row address decoder/word line driver unit 12a keeps all of the regular word lines WL1 to WLm inactive. On the other hand, while the semiconductor dynamic random access memory device is being subjected to a test on the data storage 11 before the memorization of the row addresses into the programmable memory unit 14a, the redundant word line driver unit 14c is enabled with a test control signal TEST, and becomes responsive to predetermined row address predecoded signals. Then, the redundant word line driver unit 14c sequentially energizes the redundant word lines RWL1, RWL2, . . . in synchronism with sequential change of activated row address predecoded signal, and the rows of redundant memory cells RC11 to RC1n, RC21 to RC2n, . . . are successively connected to the bit line pairs BL1 to BLn. The redundant word line driver unit 14c supplies the disable signal DIS to the row address decoder/word line driver unit 12a, and the row address decoder/regular word line driver unit 12a keeps all of the regular word lines WL1 to WLm inactive.

Figure 7:
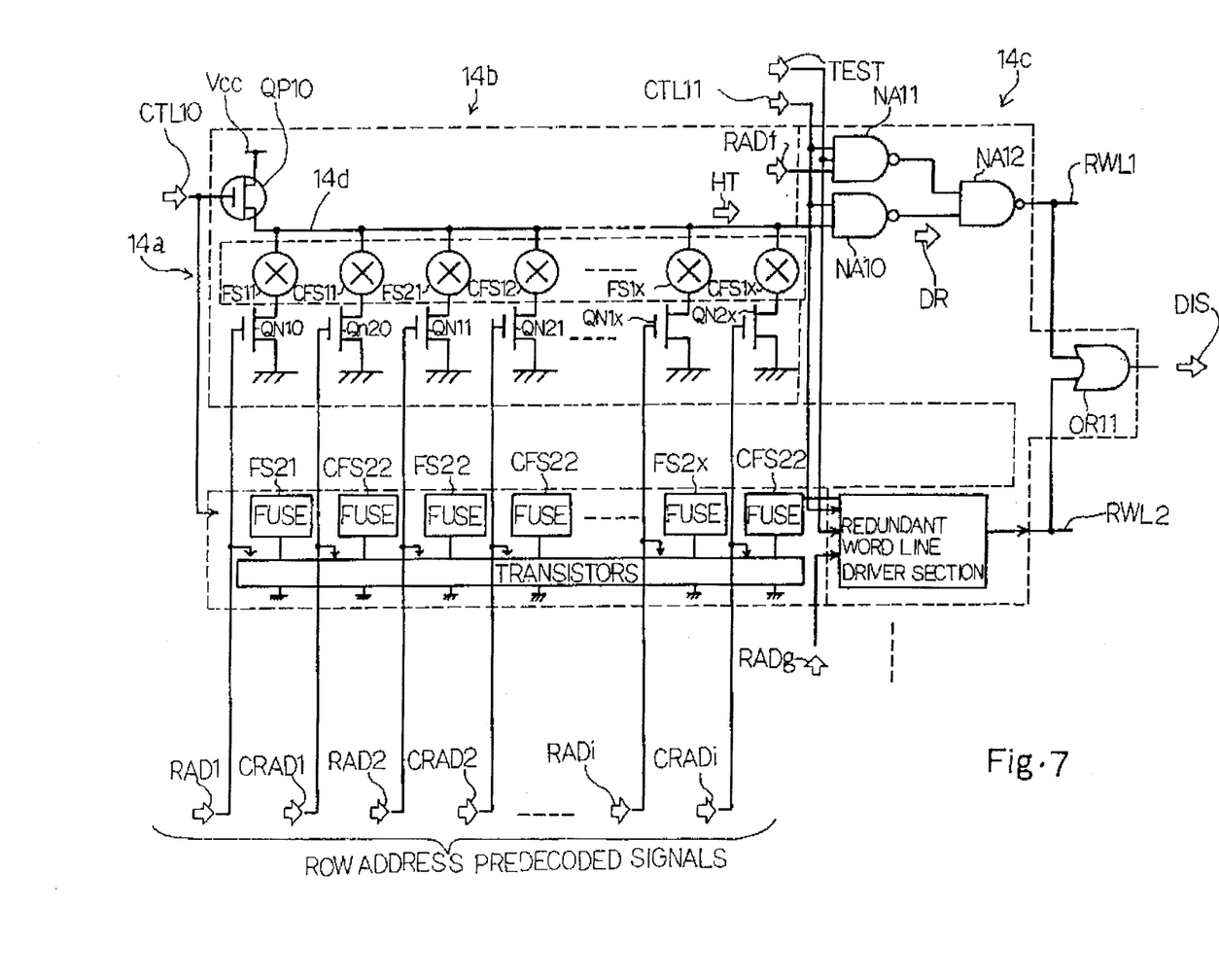
FIG. 7 is a circuit diagram showing the arrangement of a redundant system incorporated in the semiconductor dynamic random access memory device.

The programmable memory unit 14a, the redundant decoder unit 14b and the redundant word line driver unit 4c are illustrated in detail in FIG. 7. The programmable memory unit 14a is implemented by rows of fuse elements FS1/CFS1/FS12/CFS12/ . . . /FS1x/CFS1x, FS21/CFS21/FS22/CFS22/ . . . /FS2x/CFS2x, . . . respectively assigned to the redundant word lines RWL1, RWL2, . . . and, accordingly, the rows of redundant memory cells RC11 to RC1n, RC21 to RC2n, . . . . The fuse elements FS1/CFS1/FS12/CFS12/ . . . /FS1x/CFS1x, FS21/CFS21/FS22/CFS22/ . . . /FS2x/CFS2x, . . . are breakable by using a laser beam or heat, by way of example, and store a row address of a row of regular memory cells. If a row address bit is logic "1" level, the fuse element FS11, FS21, . . . or FS1x is broken. On the other hand, the fuse element CFS11, CFS21 or CFS1x 1 is broken for a row address bit of logic "0" level. For example, if a row of regular memory cells is assigned a row address "10 . . . 1" and contains a defective regular memory cell, the manufacturer can replace the row of regular memory cells with the row of redundant memory cells RC11 to RC1n in so far as no defective redundant memory cell is contained. The manufacturer breaks the fuse elements FS11, CFS12, . . . and FS1x for storing the row address "10 . . . 1", and the other fuse elements CFS11, FS12, . . . and CFS1x are not broken. The row address is stored in the programmable memory unit 14a after the tests. For this reason, the tests are carried out without an influence due to the programming on the fuse elements.

The redundant decoder unit 14b is broken down into a plurality of decoder sections respectively associated with the redundant word lines RWL1/RWL2, . . . , and the plurality of decoder sections are identical in circuit arrangement with one another. For this reason, description is made on one of the decoder sections associated with the redundant word line RWL1 only. The decoder section comprises a common charge line 14d coupled to the associated row of fuse elements FS11 to CFS1x, a p-channel enhancement type charging transistor QP10 coupled Between a positive power voltage line Vcc and the common charge line 14d and a parallel combination of n-channel enhancement type switching transistors QN10, QN20, QN11, QN21, . . . QN1x and QN2x coupled between the fuse elements FS11 to CFS1x and a ground voltage line.

The p-channel enhancement type charging transistor QP10 is responsive to an internal control signal CTL10 of active low level for charging the common charge line 14d to the positive power voltage level Vcc. All of the n-channel enhancement type switching transistors QN10 to QN2x are connected between the fuse elements FS11 to CFS1x and the ground voltage line, and the row address predecoded signals RAD1, CRAD1, RAD2, CRAD2, . . . RADi and CRADi are supplied to the gate electrodes of the n-channel enhancement type switching transistors QN10 to QN2x, respectively. The row address predecoded signals CRAD1, CRAD2, . . . and CRADi are respective complementary signals of the row address predecoded signals RAD1, RAD2, . . . and RADi. While all of the fuse elements FS11 to CFS1x are providing current paths from the common charge line 14d to the associated n-channel enhancement type switching transistors QN10 to QN2x, the n-channel enhancement type switching transistors FS11, FS12, . . . and FS1x or the n-channel enhancement type switching transistors CFS11, CFS12, . . . and CFS1x discharge the common charge line 14d to the ground voltage line. However, when the fuse elements FS11 to CFS1x are programmed through the selective breakage, the common charge line 14d is discharged with the row address predecoded signals RAD1 to CRADi representing a row address different from the row address stored in the fuse elements FS11 to CFS1x. When the row address represented by the row address predecoded signals RAD1 to CRADi are matched with the row address stored in the fuse elements FS11 to CFS1i, no current path is established between the common charge line 14d to the ground voltage line, and a hit signal HT of the active high level is generated on the common charge line 14d. For example, if the fuse elements FS11 to CFS1x store the row address "10 . . . 1", the row address predecoded signals representing the row address "10 . . . 1" contain the row address predecoded signals RAD1, . . . and RADi of logic "1" level and the row address predecoded signals CRAD2, . . . of logic "1" level. Although the row address predecoded signals RAD1, CRAD2, . . . and RADi cause the n-channel enhancement type switching transistors QN10, QN21, . . . and QN1x to turn on, the associated fuse elements FS11, CFS12, . . . and FS1x cut off the current paths through the n-channel enhancement type switching transistors QN10, QN21, . . . and QN1x, and the common charge line 14d is electrically isolated from the ground voltage line. In this instance, the row address predecoded signals RAD1 to CRADi are indicative of first address bits.

The redundant word line driver unit 14c is also broken down into a plurality of redundant word line driver sections respectively associated with the redundant decoder sections, and all of the redundant word line driver sections are identical in circuit arrangement with one another. Each of the redundant word line driver sections comprises NAND gates NA10, NA11 and NA12, and an OR gate OR11 is shared between the plurality of redundant word line driver sections.

An internal control signal CTL11 causes the NAND gate NA10 to be responsive to the hit signal HT generated on the common charge line 14d. When the hit signal HT is changed to the active high level, the NAND gate NA10 yields a drive signal AD of the active low level, and the redundant word line driver unit 14c changes the associated redundant word line RWL1 to an active high level.

The NAND gate NA11 is enabled with the internal control signal CTL11 and the test signal TEST in the test mode, and becomes responsive to an address predecoded signal RADf. Although the NAND gates NA11 of the other redundant word line driver sections are also enabled with the internal control signal CTL11 and the test signal TEST in the test mode, the other NAND gates NA11 are responsive to other address predecoded signals RADg, . . . , and the redundant word line driver unit 14c is controllable by using these address predecoded signals RADf, RADg . . . in the test mode. The address predecoded signals RADf, RADg, . . . are supplied from the outside of the semiconductor dynamic random access memory device, and serve as second address bits.

The driving signal DR and the output signal of the NAND gate NA11 are supplied to the input nodes of the NAND gate NA12, and the NAND gate NA12 energizes the associated redundant word line. Namely, the NAND gate NA11 supplies the output signal of the high-level to the NAND gate NA12 in the standard mode due to the test signal of the inactive low level, and the NAND gate NA12 is responsive to the driving signal DR supplied from the associated redundant decoder section. On the other hand, the hit signal HT is maintained at the low level in the test mode, and the NAND gate NA10 keeps the driving signal DR at the high level. As a result, the NAND gate NA12 is enabled with the driving signal AD of the high level, and is responsive to the output signal of the NAND gate NA11 and, accordingly, the address predecoded signal RADf.

If one of the redundant word lines RWL1, RWL2, . . . is energized in both standard and test modes, the OR gate OR11 changes the disable signal DIS to the active high level, and the row address decoder/regular word line driver unit 12a is never responsive to the row address predecoded signals RAD1 to CRADi.

Figure 8:
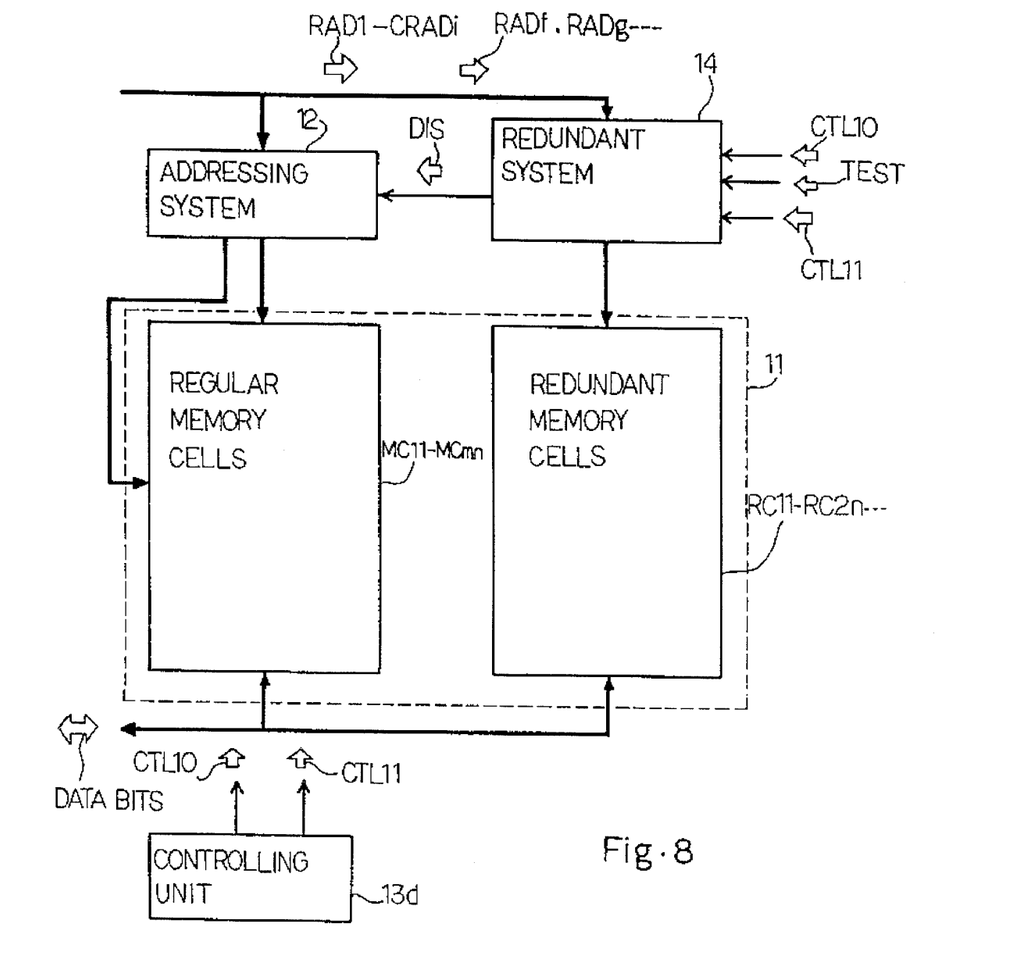
FIG. 8 is a schematic view showing a data storage incorporated in the semiconductor dynamic random access memory device.

The essential parts of the semiconductor dynamic random access memory device is summarized in FIG. 8 of the drawings. The addressing system 12 is responsive to the row address predecoded signals RAD1 to CRADi and the column address predecoded signals in the standard mode so as to allow the external device to selectively access the regular memory cells MC11 to MCmn. On the other hand, the redundant system 14 is responsive to the row address predecoded signals RAD1 to CRADi in the standard mode so as to replace a defective row of regular memory cells with a row of redundant memory cells, and is responsive to the address predecoded signals RADf, RADg, . . . in the test mode for sequentially selecting the redundant memory cells.

The dynamic random access memory device thus arranged is treated in the test mode as follows. Upon completion of a fabrication process, the semiconductor dynamic random access memory device is coupled to the testing apparatus, and is subjected to various tests for screening out defective products. One of the tests is carried out on the data storage 11 to see whether or not all the regular/redundant memory cells to be addressed are excellent. In the test sequence, the testing apparatus writes test bits into the regular/redundant memory cells, and, thereafter, reads the test bits from the regular/redundant memory cells. If the read-out test bits are identical in logic level with the write-in test bits, the regular/redundant memory cells are excellent. However, if not, the testing apparatus determines the regular/redundant memory cells to be defective.

The test sequence for the regular/redundant memory cells is similar to that of the second prior art shown in FIG. 5. Namely, the testing apparatus carries out the test on the regular memory cells MC11 to MCmn, and examines whether or not a defective regular memory cell is incorporated in the regular memory cell array 11a. If all of the regular memory cells MC11 to MCmn are excellent, the testing apparatus decides the semiconductor dynamic random access memory device to be an excellent product, and terminates the test sequence.

On the other hand, if defective rows of regular memory cells are found, the testing apparatus memorizes the row addresses in an internal memory, and carries out the test on the redundant memory cells. The test on the redundant memory cells RC11 to RC1n, RC21 to RC2n, . . . is continuously carried out after the test on the regular memory cells MC11 to MCmn by changing the potential level of the test signal TEST.

While the test is being carried out, the hit signal HT is changed to the low level at all times, and the NAND gates NA10 enable the associated NAND gates NA12 with the driving signals DR of the high level, and the testing apparatus sequentially changes the row address bits so that the NAND gates NA12 sequentially energize the associated redundant word lines RWL1, RWL2, . . . . The OR gate changes the disable signal to the active high level, and the row address decoder/regular word line driver unit 12a does not respond to the row address predecoded signals RAD1 to CRADi. For this reason, the test bits are written into and read out from the selected row of redundant memory cells, and the testing apparatus diagnoses the rows of redundant memory cells.

Subsequently, the testing apparatus memorizes the excellent rows of redundant memory cells in the internal memory, and checks the internal memory to see whether or not the defective rows of regular memory cells are greater than the excellent rows of redundant memory cells.

If the defective rows of regular memory cells are greater than the excellent rows of redundant memory cells, the redundant memory cell array 11b can not rescue the semiconductor dynamic random access memory device, and the semiconductor dynamic random access memory device is rejected as a defective product.

On the other hand, if the defective rows of regular memory cells are equal to or less than the excellent rows of redundant memory cells, the manufacturer selectively breaks the rows of fuse elements FS11 to CFS1x associated with the excellent rows of redundant memory cells, and the row addresses of the defective rows are stored in the programmable memory unit 14a.

The manufacturer confirms the regular/replaced redundant memory cells to be excellent by using the testing apparatus, and decides the semiconductor memory device be an excellent product.

After an installation into an electronic circuit, the semiconductor dynamic random access memory device serves as a data storage of the electronic system. The external device supplies the external control signals and the external address signals to the dynamic random access memory device for reading out and rewriting the data bits stored in the regular/redundant memory cells. Before completion of the previous data access, the controlling unit 13d changes the precharge control signal PC to the active level, and the precharge/balancing unit 13a charges the bit line pairs BL11 to BLn to the precharge level between the high and low levels.

The controlling unit 13d changes the internal control signal CTL10 to the active low level, and the p-channel enhancement type charging transistor QP10 turns on for charging the common charge line 14d to the positive power voltage level Vcc. The row address predecoded signals RAD1 to CRADi are supplied to the row address decoder/regular word line driver unit 12a and the redundant decoder unit 14b. The common charge lines 14d are discharged through at the n-channel enhancement type switching transistors QN10 to QN2x, because the row addresses stored in the programmable memory unit 14a are not matched with the row address represented by the row address predecoded signals RAD1 to CRADi. The NAND gates NA11 are enabling the NAND gates NA12 in the standard mode. After the row address predecoded signals RAD1 to CRADi determine the potential levels on the common charge lines 14d, the controlling unit 13d changes the internal control signal CTL11 to the active high level, and the internal control signal CTL11 causes the NAND gates NA10 to respond to the potential levels on the common charge lines 14d. Since the common charge lines 14d are in the low level, the NAND gates NA10 change the driving signals DR to the high level, and all of the NAND gates NA12 keeps the associated redundant word lines RWL1, RWL2, . . . at the low level. Therefore, the disable signal DIS is maintained at the inactive low level, and the row address decoder unit/regular word line driver unit 12a responds to the row address predecoded signals RAD1 to CRADi, and energizes one of the regular word lines WL1 to WLm.

If the internal write enable signal WE is active, the read/write unit 13c generates a potential difference representative of a new data bit on the common data bus DB, and the column selector unit 12b transfers the potential difference to one of the bit line pairs BL1 to BLn. As a result, the new data bit is written into the regular memory cell specified by the external address signals, and is stored in the form of electric charge.

On the other hand, if the internal write enable signal WE is inactive, the controlling unit 13d changes the internal control signal ACT to the active level, and the sense amplifier unit 13b develops small potential differences on the bit line pairs BL1 to BLn. The potential differences are developed, and is transferred through the column selector unit 12b to the data bus DB. The read/write unit 13c generates the output data signal from the potential difference indicative of the accessed data bit, and the output data signal is supplied to the external device.

When the row address supplied from the external device is indicative of the defective row of regular memory cells replaced with one of the excellent rows of redundant memory cells, the redundant decoder unit 14b and the redundant word line driver unit 14c energizes the redundant word line, and the disable signal DIS does not allow the row address decoder/regular word line driver unit 12a to respond to the row address predecoded signals. As a result, the redundant word line is energized instead of the regular word line, and the read/write system 13 writes or reads a data bit from the redundant memory cell.

Tables 1 and 2 show the potential levels of the essential signals in the test mode and the standard mode, respectively.

In table 1 and 2, "H" and "L" means the high level and the low level, and MC and RC stand for the regular memory cells and the redundant memory cells. Mark * means "don't care".

As will be understood from the foregoing description, the redundant word line driver unit 14c serves as the redundant addressing unit, and is shared between the write-in/read-out sequences and the test operation. Comparing FIG. 7 with FIG. 2, only two NAND gates NA11 and NA12 are added for each redundant word line, and an occupation area for the NAND gates NA11 and NA12 is smaller than the occupation area for the pointer 8 and the AND gate AD2. This results in that the real estate of the semiconductor substrate is effectively available for increasing the memory capacity.

Figure 9:
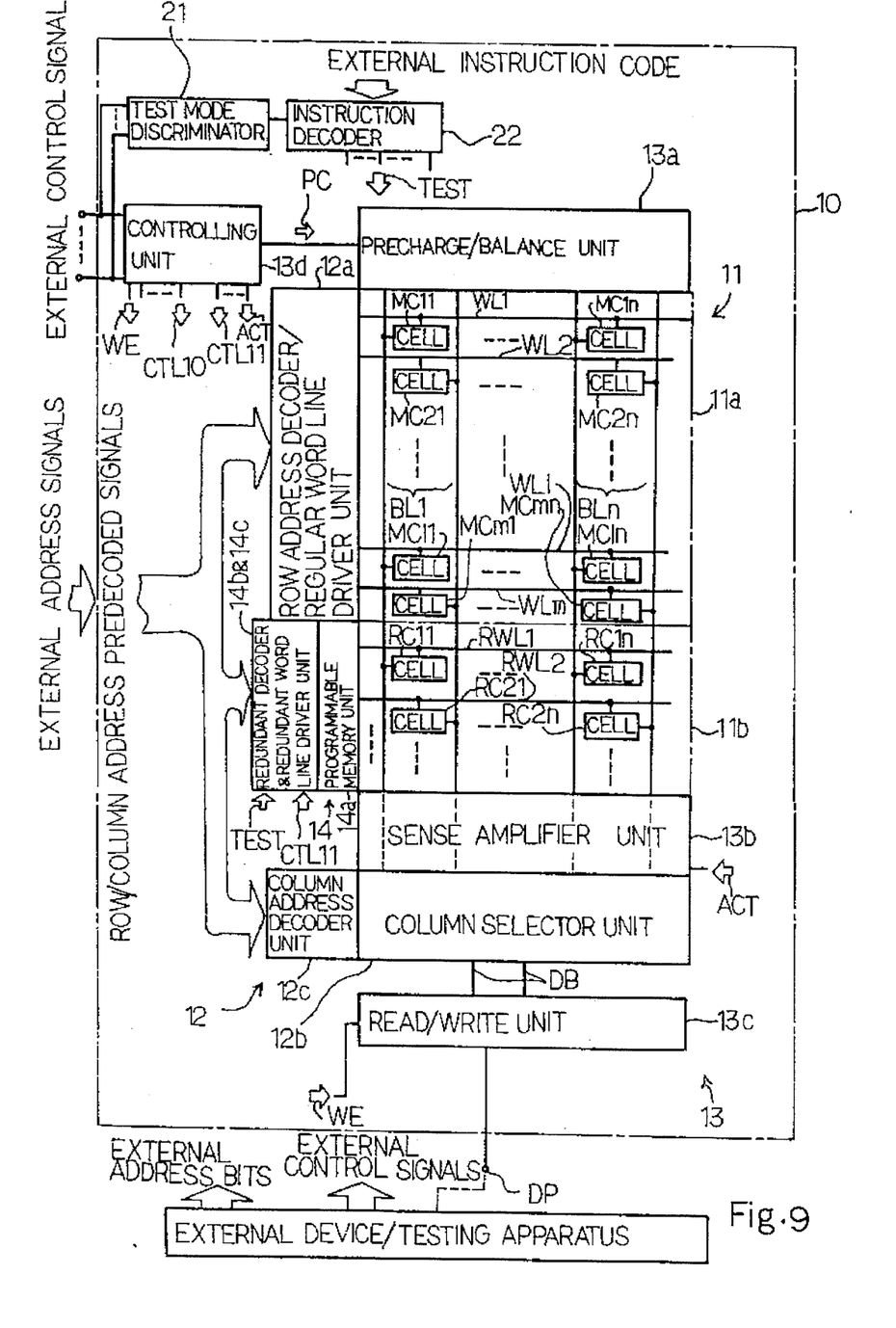
FIG. 9 is a block diagram showing a modification of the semiconductor dynamic random access memory device.

The first embodiment is modifiable as follows. A semiconductor dynamic random access memory device enters into a test mode when predetermined external control signals such as CAS, RAS and WE are changed in a predetermined pattern, and an external instruction code is decoded so as to generate the test signal TEST. Namely, the first modification is equipped with a test mode discriminator 21 and an instruction decoder 22 as shown in FIG. 9. When the testing apparatus changes the external control signals CAS, RAS and WE in a predetermined sequence, the mode discriminator 21 acknowledges a request for the test mode, and activates the instruction decoder 22. While the semiconductor dynamic random access memory device is operating in the standard mode, the external control signals CAS, RAS and WE are never changed in the predetermined sequence. The instruction code is supplied from the testing apparatus to signal pins not used in the test mode, and the instruction decoder 22 generates various test signals. One of the test signals is used for the redundant word line driver unit 14c, and is labeled with "TEST".

Second Embodiment

Figure 10:
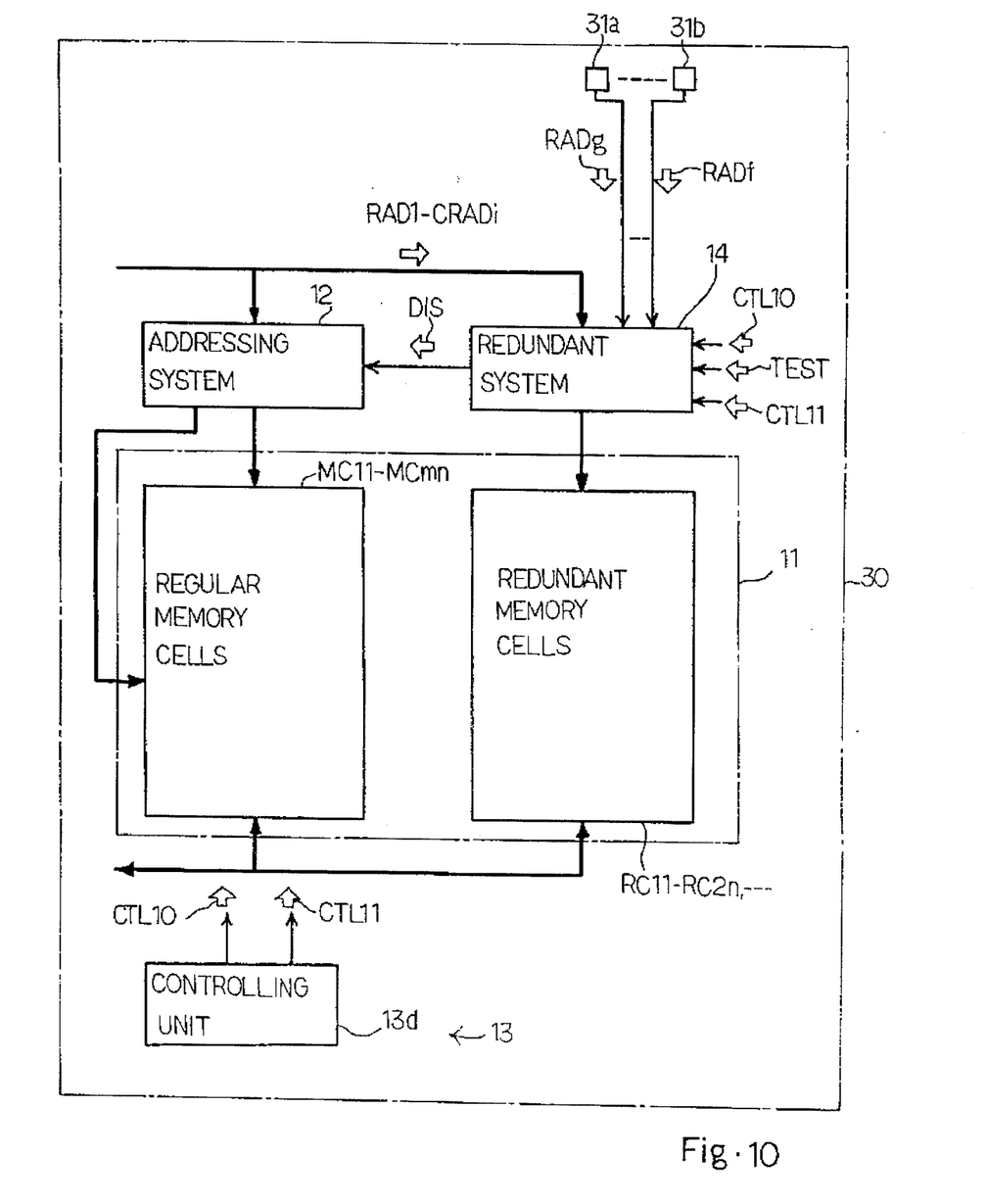
FIG. 10 is a schematic view showing essential parts of another semiconductor memory device according to the present invention.

FIG. 10 illustrates another semiconductor dynamic random access memory device embodying the present invention, and is fabricated on a semiconductor substrate 30. The semiconductor dynamic random access memory device implementing the second embodiment is different from the first embodiment in that the address signals RADf, RADg, . . . are directly supplied from pads 31a, 31b, . . . to the redundant system 14. The data storage, the addressing system, the read/write system and the redundant system are similar in arrangement to those of the first embodiment, and, for this reason, they are labeled with the same references

TABLE 1

| signal | TEST | RADf | HT | RWL1 | DIS | note |
| --- | --- | --- | --- | --- | --- | --- |
| test on redundant memory cells | H | H | L | H | H | MC: non-accessible RC: accessible |
| test on regular memory cells | H | L | L | L | L | MC: accessible RC: non-accessible |

TABLE 2

| signal | TEST | RADf | HT | RWL1 | DIS | note |
| --- | --- | --- | --- | --- | --- | --- |
| redundant memory cells | L | * | H | H | H | MC: non-accessible RC: accessible |
| regular memory cells | L | * | L | L | L | MC: accessible RC: non-accessible | designating the corresponding systems without detailed description.

The tests are usually carried out before packaging, and the pads 31a, 31b, . . . are never connected to external pins. If the address predecoded signals are used for selecting the redundant word lines RWL1, RWL2, . . . in the test mode, the selection of the redundant word line is delayed due to large parasitic capacitance coupled to the address predecoded signal lines. However, the address signals RADf, RADg, . . . are directly supplied through the pads 31a, 31b, . . . to the NAND gates NA11 of the redundant word line driver unit 14c in the second embodiment, and, for this reason, the test on the redundant memory cells RC11–RC1n, RC21–RC2n, . . . is rapidly completed rather than the first embodiment.

Although particular embodiments of the present invention have been shown and described, it will be obvious to those skilled in the art that various changes and modifications may be made without departing from the spirit and scope of the present invention. For example, the redundant technology according to the present invention is applicable to another semiconductor memory device such as, for example, a static random access memory device or a non-volatile semiconductor memory device.

Moreover, the semiconductor memory device may form a part of an ultra large scale integration together with other function blocks. The second address bits may be supplied from some control signal pins or other signal pins exclusively assigned thereto to the redundant addressing unit. The present invention is applicable to a semiconductor memory device equipped with columns of redundant memory cells and another semiconductor memory device equipped with both rows and columns of redundant memory cells.

What is claimed is:

1. A semiconductor memory device having a standard mode and a test mode, comprising:

a) a plurality of addressable regular memory cell groups for storing data bits;

b) a plurality of addressable redundant memory cell groups, each of said plurality of addressable regular memory cell groups being replaceable with one of said plurality of addressable redundant memory cell groups;

c) an addressing system responsive to a plurality of external address bits in both standard and test modes so as to allow an external device to selectively access said data bits stored in said plurality of addressable regular memory cell groups in the absence of a disable signal; and d) a redundant system having d-1) a programmable memory unit for storing at least one address assigned to one of said plurality of addressable regular memory cell groups after said test mode, d-2) a redundant decoder unit activated in said standard mode and operative to compare an address represented by first address bits of said plurality of address bits with said at least one address to see whether or not said address is matched with said at least one address, said redundant decoder unit generating a hit signal when said address is matched with said at least one address, and d-3) a redundant addressing unit responsive to said hit signal in said standard mode so as to replace said one of said plurality of addressable regular memory cell groups with one of said plurality of redundant memory cell groups assigned said at least one address in said standard mode, said redundant addressing unit being further operative to generate said disable signal when said one of said plurality of redundant memory cell groups is selected in both standard and test modes, said redundant addressing unit being further responsive to second address bits in the presence of a test signal in said test mode so as to allow an external device to sequentially access said plurality of redundant memory cell groups.

2. The semiconductor memory device as set forth in claim 1, in which said test signal is supplied from the outside of said semiconductor memory device.

3. The semiconductor memory device as set forth in claim 1, in which said test signal is generated from an external command.

4. A semiconductor memory device having a standard mode and a test mode, comprising:

a) a plurality of addressable regular memory cell groups for storing data bits;

b) a plurality of addressable redundant memory cell groups, each of said plurality of addressable regular memory cell groups being replaceable with one of said plurality of addressable redundant memory cell groups;

c) an addressing system responsive to a plurality of external address bits in both standard and test modes so as to allow an external device to selectively access said data bits stored in said plurality of addressable regular memory cell groups in the absence of a disable signal; and d) a redundant system having d-1) a programmable memory unit for storing at least one address assigned to one of said plurality of addressable regular memory cell groups after said test mode, d-2) a redundant decoder unit activated in said standard mode and operative to compare an address represented by first address bits of said plurality of address bits with said at least one address to see whether or not said address is matched with said at least one address, said redundant decoder unit generating a hit signal when said address is matched with said at least one address, and d-3 a redundant addressing unit responsive to said hit signal in said standard mode so as to replace said one of said plurality of addressable regular memory cell groups with one of said plurality of redundant memory cell groups assigned said at least one address in said standard mode, said redundant addressing unit being further operative to generate said disable signal when said one of said plurality of redundant memory cell groups is selected in both standard and test modes;

said redundant addressing unit being further responsive to second address bits in the presence of a test signal in said test mode so as to allow an external device to sequentially access said plurality of redundant memory cell groups;

said redundant addressing unit comprising a plurality of redundant addressing sub-units respectively associated with said plurality of redundant memory cell groups, each of said redundant addressing sub-units having:

a first logic gate enabled with a first internal control signal and responsive to said hit signal for changing a logic level of a driving signal;

a second logic gate enabled with said test signal and said first internal control signal and responsive to one of said second address bits for changing a logic level of an output signal thereof; and a third logic gate enabled with said driving signal in said test mode and responsive to said output signal of said second logic gate so as to make the associated redundant memory cell group accessible, said third logic gate enabled with said output signal of said second logic gate in said standard mode and responsive to said driving signal so as to make said associated redundant memory cell group accessible.

5. The semiconductor memory device as set forth in claim 4, in which said second address bits are supplied through address predecoded signal lines for supplying said plurality of address bits and said first address bits to said addressing system and said redundant system, respectively.

6. The semiconductor memory device as set forth in claim 4, in which said second address bits are supplied through pads exclusively used in said test mode only.

7. A semiconductor memory device having a standard mode and a test mode, comprising:

a) a plurality of addressable regular memory cell groups for storing data bits;

b) a plurality of addressable redundant memory cell groups, each of said plurality of addressable regular memory cell groups being replaceable with one of said plurality of addressable redundant memory cell groups;

c) an addressing system responsive to a plurality of external address bits in both standard and test modes so as to allow an external device to selectively access said data bits stored in said plurality of addressable regular memory cell groups in the absence of a disable signal; and d) a redundant system having d-1) a programmable memory unit for storing at least one address assigned to one of said plurality of addressable regular memory cell groups after said test mode, d-2) a redundant decoder unit activated in said standard mode and operative to compare an address represented by first address bits of said plurality of address bits with said at least one address to see whether or not said address is matched with said at least one address, said redundant decoder unit generating a hit signal when said address is matched with said at least one address, and d-3 a redundant addressing unit responsive to said hit signal in said standard mode so as to replace said one of said plurality of addressable regular memory cell groups with one of said plurality of redundant memory cell groups assigned said at least one address in said standard mode, said redundant addressing unit being further operative to generate said disable signal when said one of said plurality of redundant memory cell groups is selected in both standard and test modes;

said redundant addressing unit being further responsive to second address bits in the presence of a test signal in said test mode so as to allow an external device to sequentially access said plurality of redundant memory cell groups;

said plurality of regular memory cell groups and said plurality of redundant memory cell groups being rows of regular memory cells and rows of redundant memory cells;

said redundant addressing unit comprising a plurality of redundant addressing sub-units respectively associated with redundant word lines coupled to said rows of redundant memory cells;

each of said redundant addressing sub-units having:

a first logic gate enabled with a first internal control signal and responsive to said hit signal for changing a logic level of a driving signal;

a second logic gate enabled with said test signal and said first internal control signal and responsive to one of said second address bits for changing a logic level of an output signal thereof; and a third logic gate enabled with said driving signal in said test mode and responsive to said output signal of said second logic gate so as to energize the associated redundant word line, said third logic gate enabled with said output signal of said second logic gate in said standard mode and responsive to said driving signal so as to energize the associated redundant word line.

8. The semiconductor memory device as set forth in claim 1, wherein:

said redundant addressing unit comprises redundant addressing sub-units respectively associated with said plurality of redundant memory cell groups; and each of said plurality of redundant addressing sub-units includes:

a redundant word line driver, and logic gates for allowing said redundant word line driver to function as a pointer.

* * * * *